(12) United States Patent
Dornhof

(10) Patent No.: US 7,589,489 B2
(45) Date of Patent: Sep. 15, 2009

(54) METHOD AND ARRANGEMENT FOR CONTROLLING THE ELECTRICITY SUPPLY OF AN ELECTRONICALLY COMMUTATED MOTOR

(75) Inventor: Konstantin Dornhof, Immendingen (DE)

(73) Assignee: EBM-Papst St. Georgen GmbH & Co. KG, St. Georgen (DE)

( * ) Notice: Subject to any disclaimer, the term of this patent is extended or adjusted under 35 U.S.C. 154(b) by 0 days.

(21) Appl. No.: 11/576,885

(22) PCT Filed: Aug. 6, 2005

(86) PCT No.: PCT/EP2005/008546

§ 371 (c)(1),
(2), (4) Date: Apr. 8, 2007

(87) PCT Pub. No.: WO2006/039956

PCT Pub. Date: Apr. 20, 2006

(65) Prior Publication Data

US 2008/0088265 A1    Apr. 17, 2008

(30) Foreign Application Priority Data

Oct. 9, 2004   (DE) .................. 10 2004 049 985

(51) Int. Cl.
*H02P 23/00*   (2006.01)
(52) U.S. Cl. .............. 318/799; 318/400.06; 318/400.27
(58) Field of Classification Search .......... 318/799, 318/400.06, 400.27, 400.4, 400.28; 307/570
See application file for complete search history.

(56) References Cited

U.S. PATENT DOCUMENTS

| | | | |
|---|---|---|---|
| 4,760,293 A | 7/1988 | Hebenstreit | 307/570 |
| 5,534,763 A | 7/1996 | Williams et al. | 318/799 |
| 6,549,324 B2 | 4/2003 | Evans | 327/379 |
| 6,906,486 B2 | 6/2005 | Berroth et al. | 319/439 |
| 2002/0185926 A1* | 12/2002 | King et al. | 310/68 B |

OTHER PUBLICATIONS

IRLI3410, International Rectifier, datasheet on MOSFET transistor (11 pp.; May 1998, El Segundo, Calif.).

* cited by examiner

*Primary Examiner*—Karen Masih
(74) *Attorney, Agent, or Firm*—Milton Oliver, Esq.; Oliver Intellectual Property

(57) ABSTRACT

A control circuit (150) for controlling the current supplied to a winding strand (102) in an electric motor (143). The control circuit comprises at least one semiconductor switch (106) and a control unit (108) for controlling the semiconductor switch (es). Each semiconductor switch (106) is connected to a respective winding strand (102), in order to control the current in said winding strand. The control unit (108) comprises an output (110) for applying a control signal (CTRL) to the semiconductor switch (106), and is configured to set the output (110), at least upon switch-off of the semiconductor switch (106), to high impedance in order to prevent a voltage at the control unit output from influencing, during the switch-off operation, a signal input at the semiconductor switch (106). The improved control circuit increases motor efficiency and reduces commutation noise.

11 Claims, 7 Drawing Sheets

…

Figure 1:
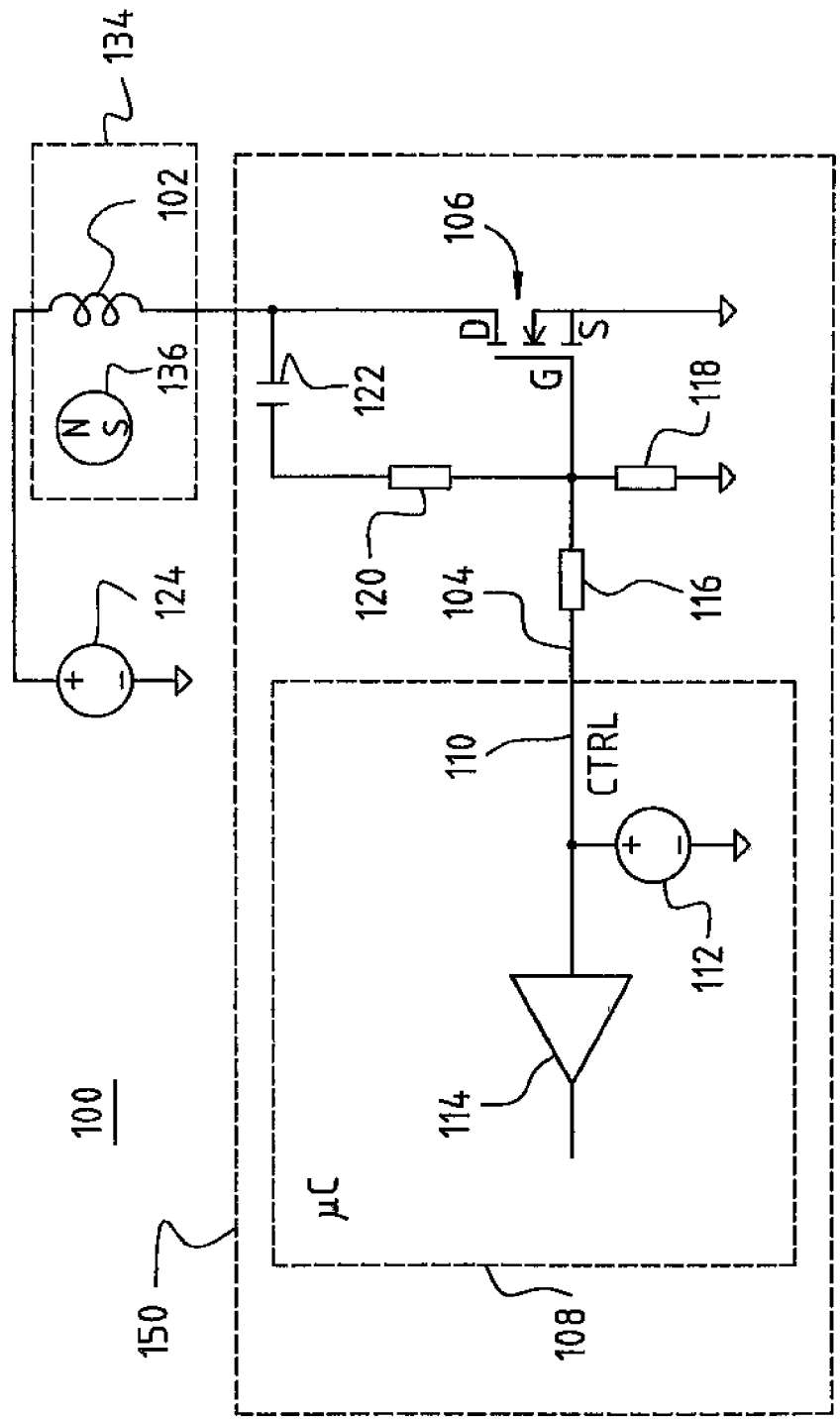

METHOD AND ARRANGEMENT FOR CONTROLLING THE ELECTRICITY SUPPLY OF AN ELECTRONICALLY COMMUTATED MOTOR

CROSS-REFERENCE

This application is a section 371 of PCT/EP05/08546 filed 6 Aug. 2005.

FIELD OF THE INVENTION

The present invention relates to a method and an arrangement for controlling the current supplied to winding strands in an electronically commutated motor (ECM).

BACKGROUND

The occurrence of motor noises during the operation of electric motors is problematic in a plurality of applications. Such motor noises occur in electric motors, inter alia, when winding strands are switched off. In the context of the operation of ECMs in which the winding strands are constantly switched on and off upon commutation, such motor noises, which are also referred to as commutation noises, can result in the excitation of unpleasant solid-borne sound.

SUMMARY OF THE INVENTION

It is an object of the present invention to make available a novel method and a novel arrangement for controlling the current supplied to an ECM. This object is achieved by the subject matter of the independent claims.

The invention is based on the recognition that motor noises occur in particular when winding strands in an electric motor are switched off quickly. A basic idea of the invention is therefore to retard the switch-off of winding strands in an electric motor.

The object of the present invention is achieved in particular by a control circuit in which a respective semiconductor switch is provided to regulate the current through each motor winding strand, and a control unit applies control signals to the gates of the semiconductor switches. In accordance therewith, according to the present invention a winding strand in an electric motor has, associated with it, a semiconductor switch, for example a field-effect transistor (FET), to control the current in the winding strand. The semiconductor switch is connected to an output of a control unit, at which output a control signal for controlling the semiconductor switch is generated. The semiconductor switch is switched on by the control signal in order to switch on the associated winding strand, and is switched off by the control signal in order to switch off said winding strand. The output of the control unit is set to high impedance at least upon switch-off of the semiconductor switch. Quick switch-off of the semiconductor switch, and thus of the associated winding strand, via the output of the control unit, can thus be prevented.

A preferred refinement of the control circuit according to the present invention is to provide a current limiting resistor between the control unit and the semiconductor switch. In accordance therewith, the control signal is applied to the semiconductor switch through a current limiting resistor arranged between the output of the control unit and the semiconductor switch, in order to avoid overloading the semiconductor switch. Because the output of the control unit is set to high impedance at least upon switch-off of said semiconductor switch, no current for switching off the semiconductor switch can flow through the current limiting resistor during the switch-off operation. A corresponding current flow is preferably dissipated through a leakage resistor arranged between the control electrodes of the semiconductor switch. The semiconductor switch is accordingly switched off via said leakage resistor.

BRIEF FIGURE DESCRIPTION

Figure 2:
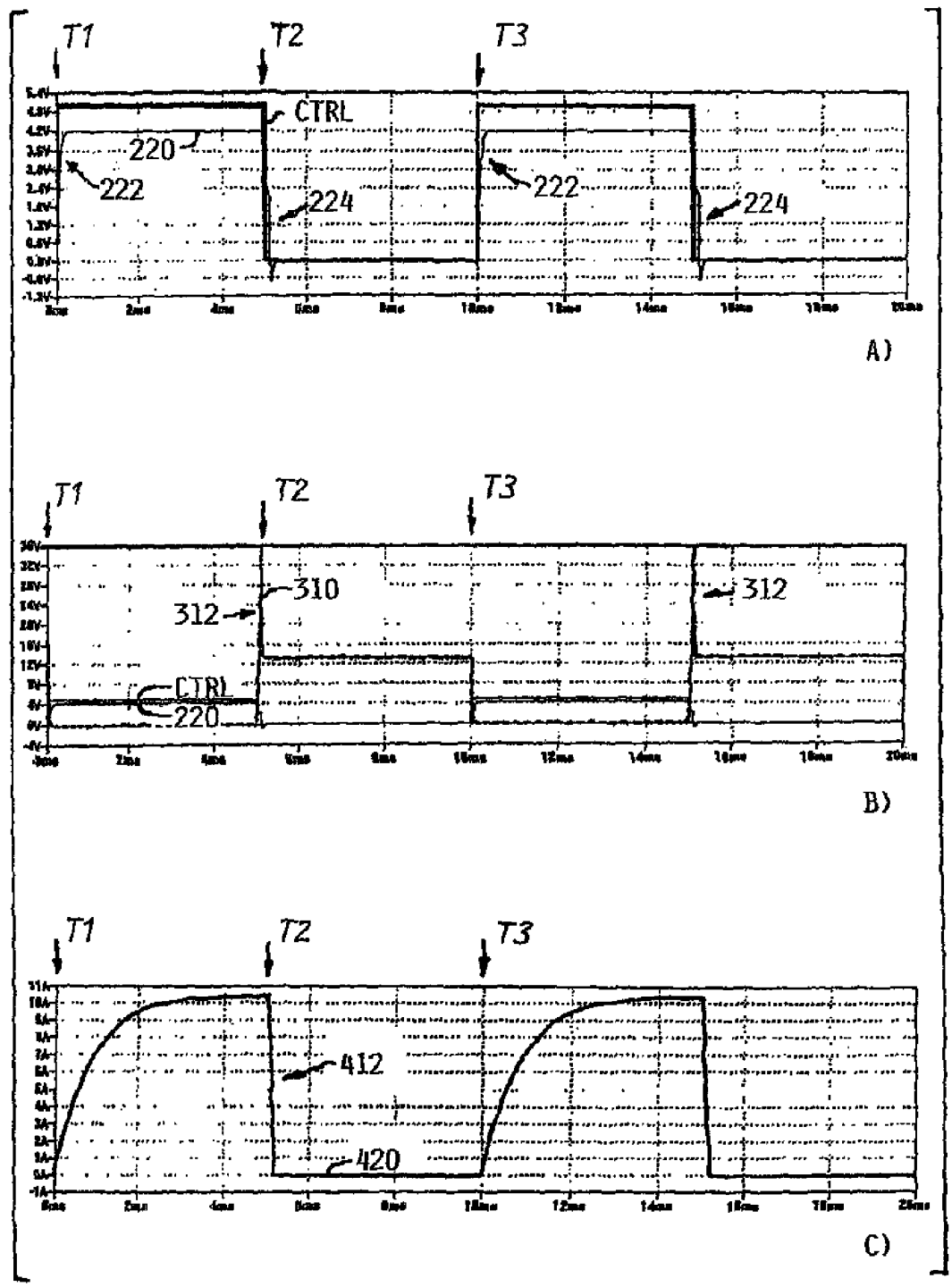
Figure 3:
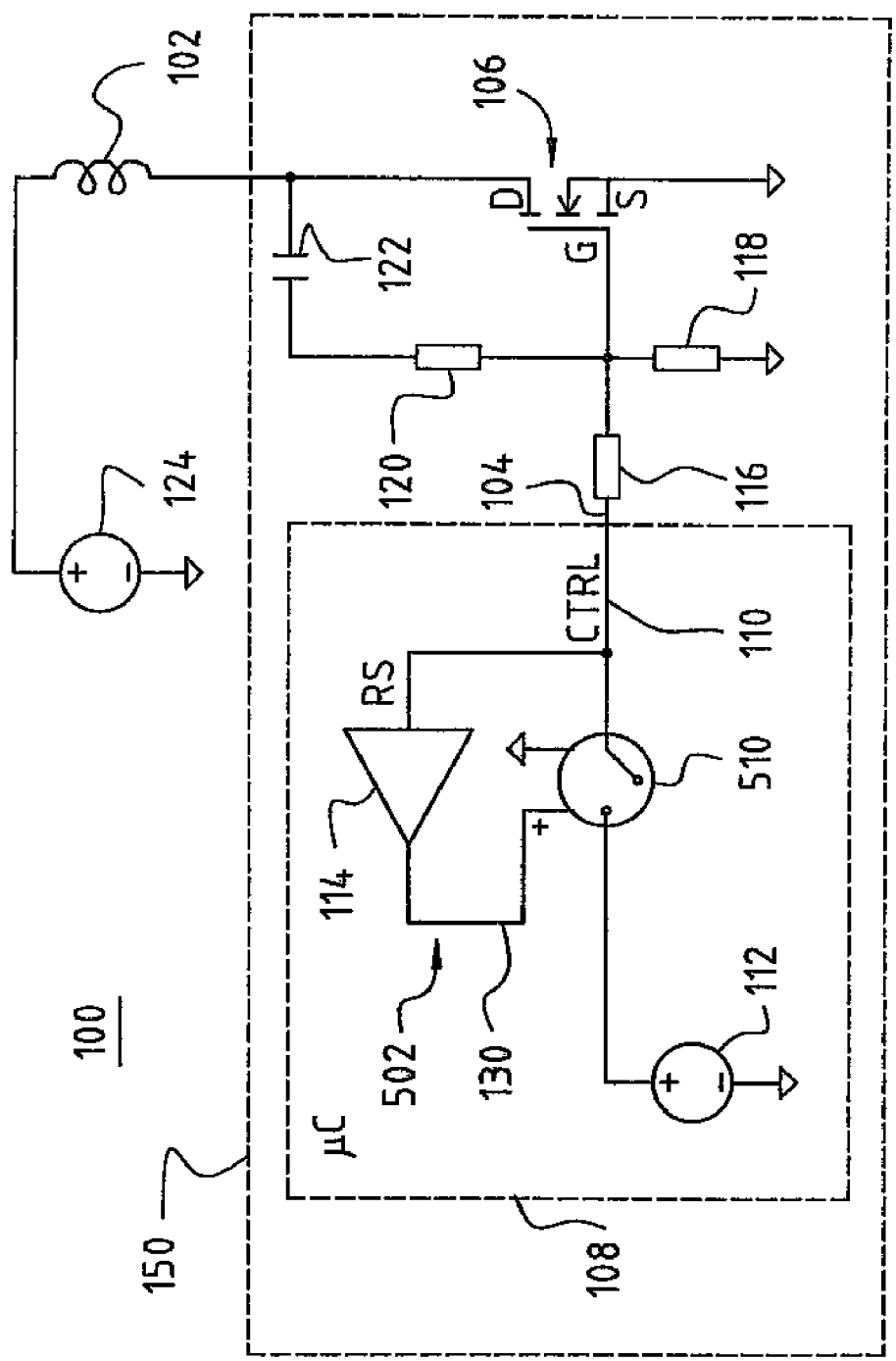
Figure 4:
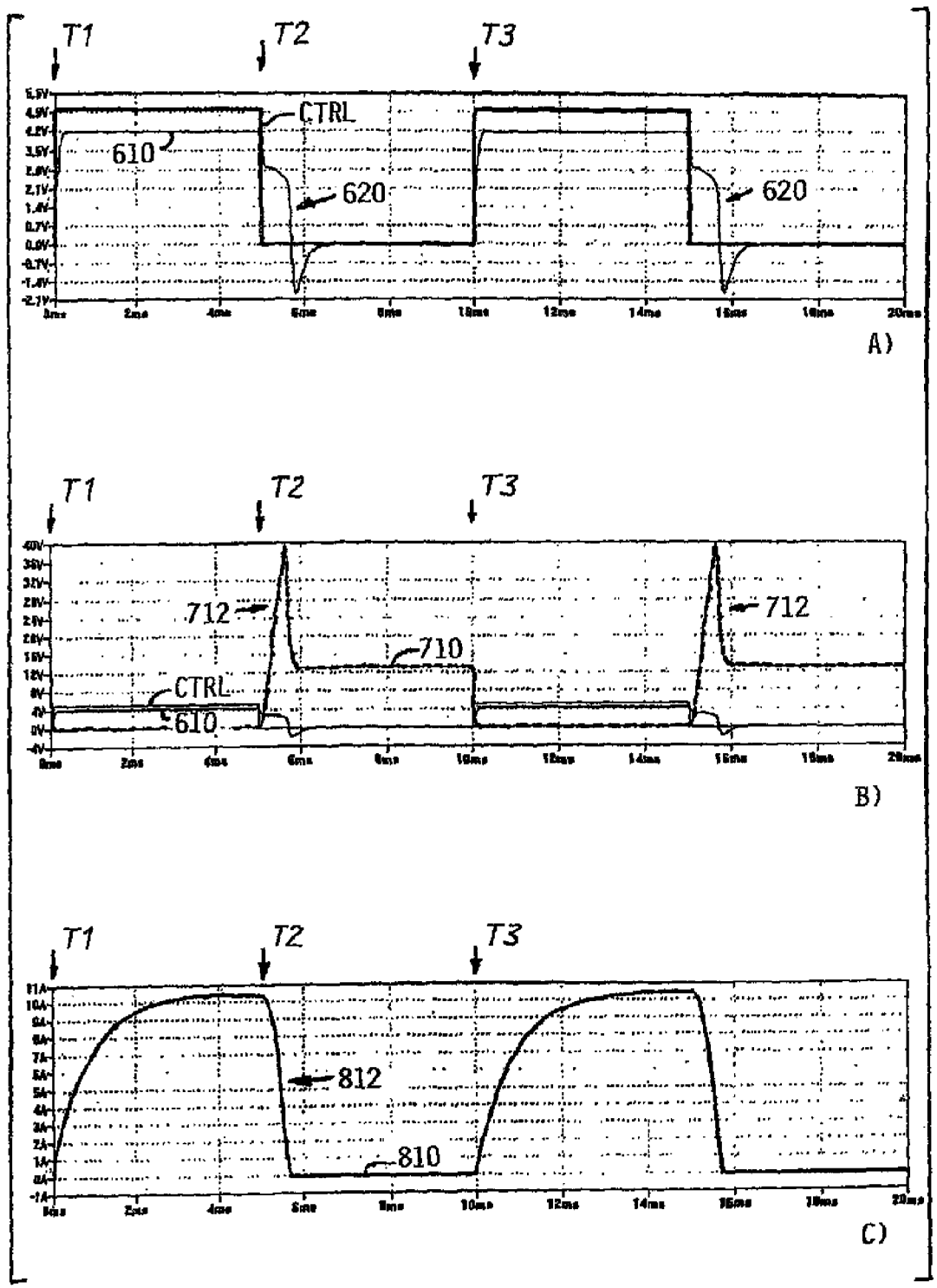
Figure 5:
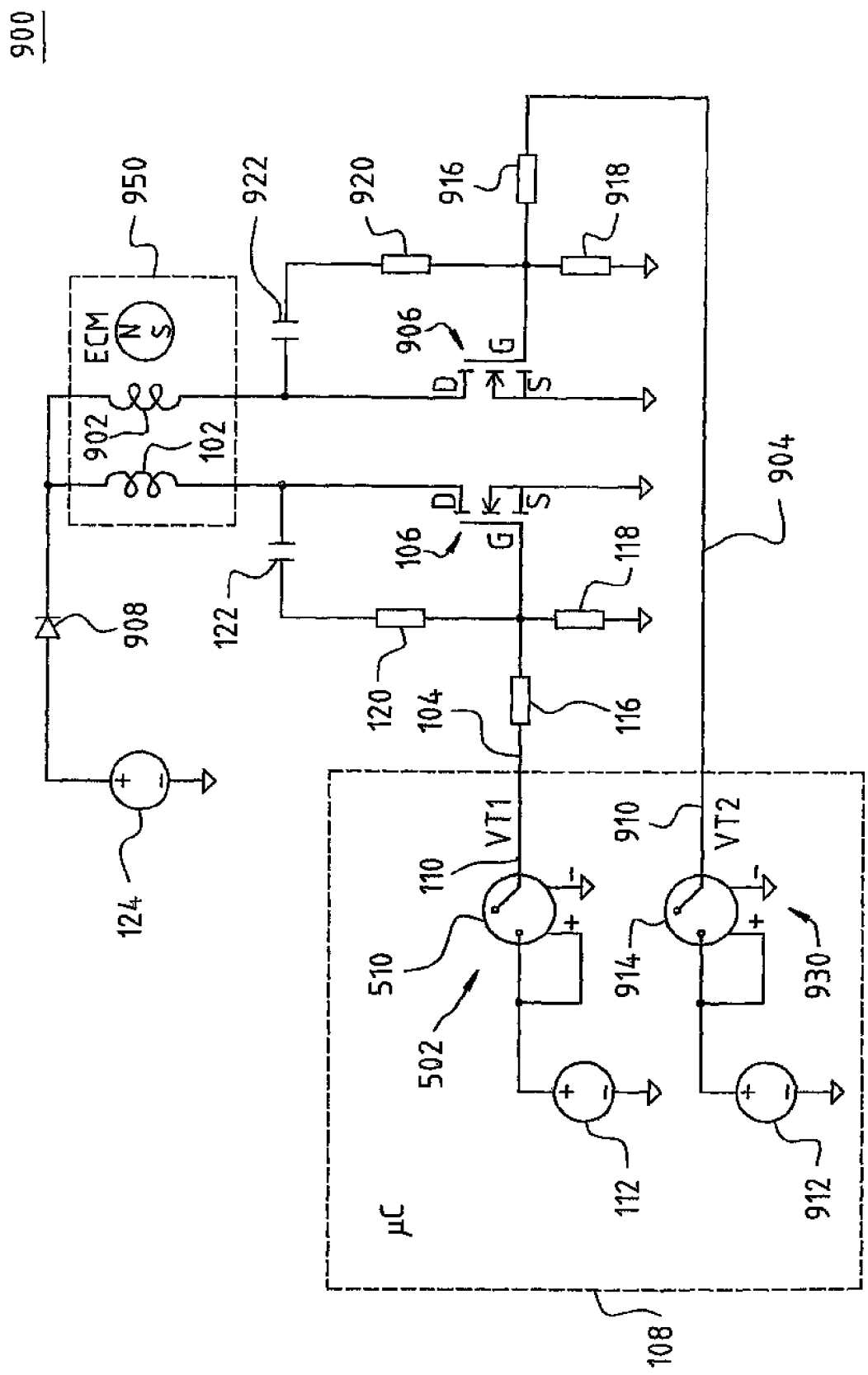
Figure 6:
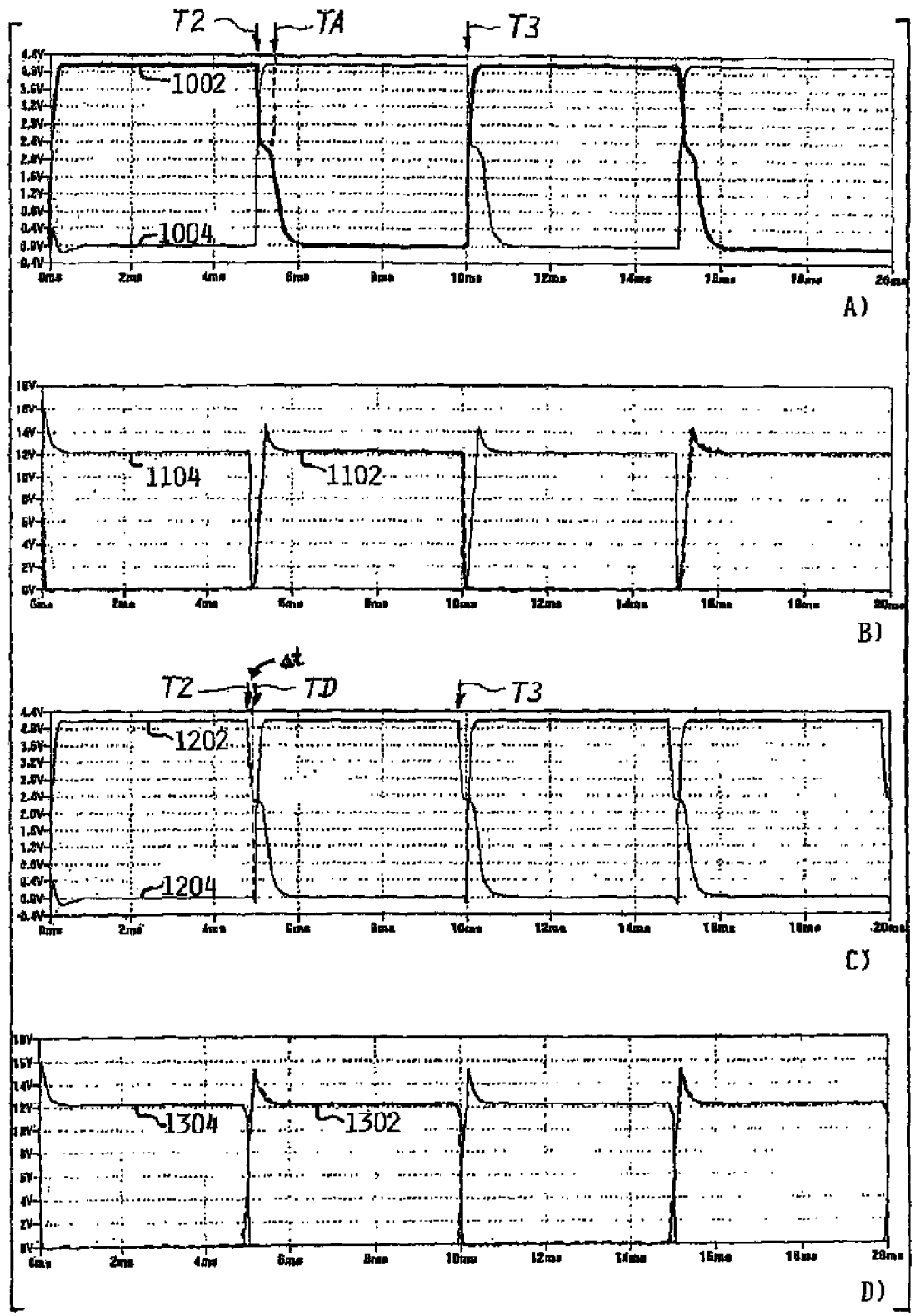
Figure 7:
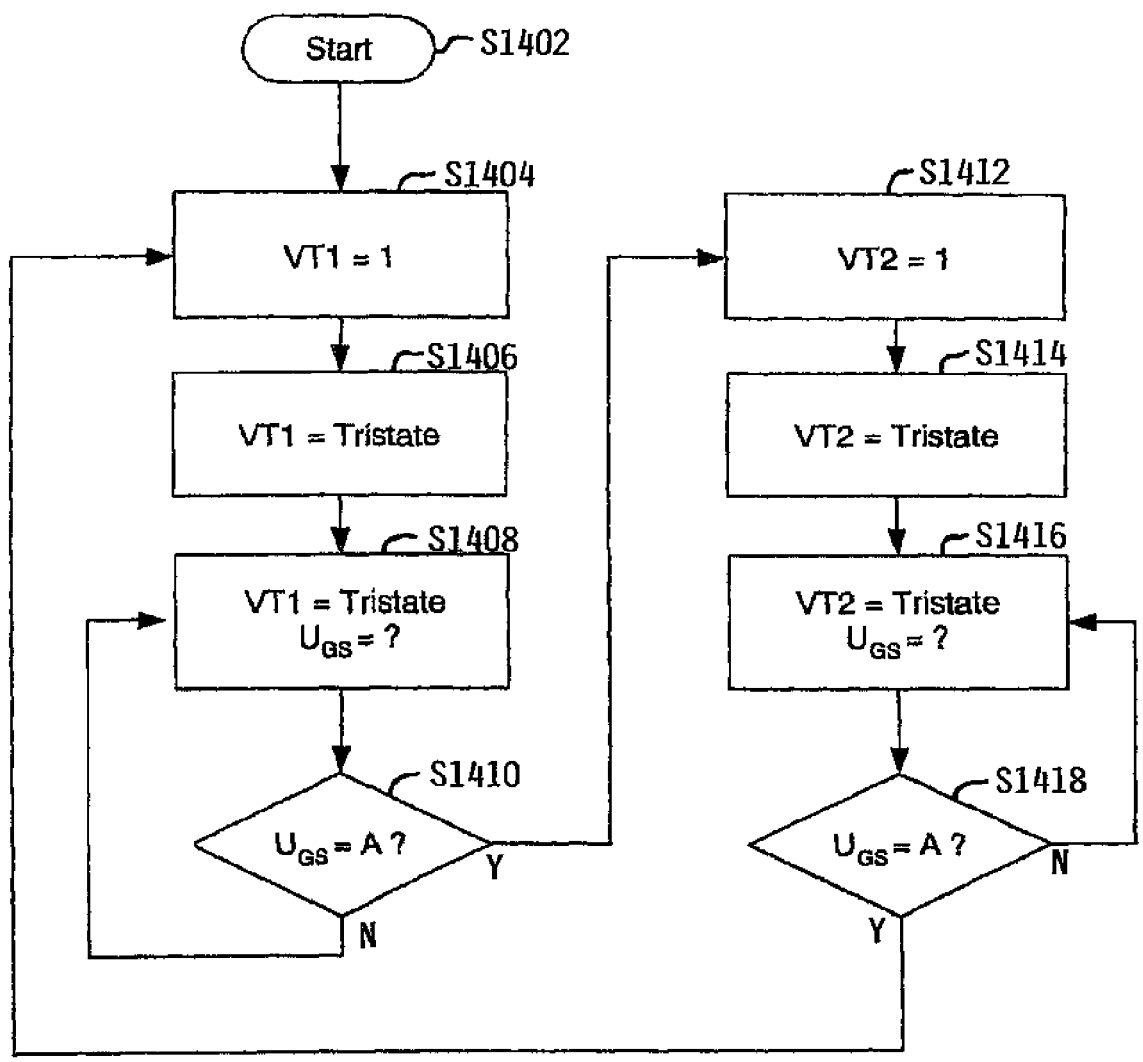

The invention is not limited to a specific type of motor. Further details and advantageous refinements of the invention are evident from the exemplifying embodiments described below and depicted in the drawings, in which:

FIG. 1 is a simplified circuit diagram of a control circuit for controlling the current supplied to a first winding strand in an electric motor, according to the invention;

FIG. 2A schematically depicts a control signal generated at the output of the control unit of FIG. 1, and a gate signal generated at the semiconductor switch of FIG. 1;

FIG. 2B schematically depicts the control signal and the gate signal of FIG. 2A, as well as a corresponding drain-source voltage at the semiconductor switch of FIG. 1;

FIG. 2C schematically depicts the current generated in the winding strand of FIG. 1;

FIG. 3 is a simplified circuit diagram of the control circuit of FIG. 1, according to a refinement of the invention;

FIG. 4A schematically depicts a control signal generated at the output of the control unit of FIG. 3, and a gate signal generated at the semiconductor switch of FIG. 3;

FIG. 4B schematically depicts the control signal and the gate signal of FIG. 4A, as well as a corresponding drain-source voltage at the semiconductor switch of FIG. 3;

FIG. 4C schematically depicts the current generated in the winding strand of FIG. 3;

FIG. 5 is a simplified circuit diagram of an application example for the control signal of FIG. 3 for controlling the current supplied to winding strands in an ECM, according to the invention;

FIG. 6A schematically depicts gate signals generated at the first and the second output of the control unit of FIG. 5; FIG. 6B schematically depicts drain-source voltages produced by the gate signals of FIG. 6A at the semiconductor switches of FIG. 5;

FIG. 6C schematically depicts control-optimized gate signals generated at the first and the second output of the control unit of FIG. 5;

FIG. 6D schematically depicts drain-source voltages produced by the control-optimized gate signals of FIG. 6C at the semiconductor switches of FIG. 5; and FIG. 7 is a flow chart of an exemplifying method for controlling the current supplied to winding strands in an ECM.

DETAILED DESCRIPTION

FIG. 1 is a simplified circuit diagram of an apparatus 100 that illustrates the working principle of a control circuit 150 according to the present invention. Said circuit is adapted to retard the switch-off of a winding strand 102 in a schematically depicted electric motor 134. Electric motor 134 has a rotor 136 that is depicted as a permanent-magnet rotor.

Control circuit 150 comprises a control unit (µC) 108 that comprises, by way of example, a control pulse source 112 and a comparator 114. Comparator 114 is connected on the output side to a control logic unit (not depicted) of control unit 108. On the input side, comparator 114 is connected to the positive pole of control pulse source 112 and to an output 110 of control unit 108. Output 110 is connected to a semiconductor switch via a control line 104 that comprises a current limiting resistor 116.

The semiconductor switch is implemented, in this exemplifying embodiment, as a field-effect transistor 106 of the n-channel MOSFET type. Control line 104 is connected to gate G of MOSFET 106. Gate G of MOSFET 106 is connected on the one hand via a leakage resistor 118 to ground, and on the other hand via an RC element 120, 122 to drain D of MOSFET 106. Source S of MOSFET 106 is connected to ground; its drain D is connected via a winding strand 102 to the positive pole of a DC link circuit 124.

During operation, a supply voltage for winding strand 102 is present at link circuit 124. The current supplied to winding strand 102 is controlled via MOSFET 106.

A control signal CTRL is generated at output 110 of control 108 and is delivered to MOSFET 106 via control line 104. In the embodiment depicted in FIG. 1, control signal CTRL is generated by control pulse source 112, which latter produces a control voltage between gate G and source S of MOSFET 106. This gate-source voltage makes MOSFET 106 conductive above a predetermined threshold value. For MOSFETs of the IRLR 3410 type, for example, this switching threshold value is between +1.8 V and +2 V. When MOSFET 106 is conductive, a current flows in winding strand 102 from DC voltage source 124 through MOSFET 106 to ground. In order to switch off MOSFET 106, control signal CTRL can be set to LOW. The potential at gate G of MOSFET 106 is thereby pulled to LOW, so that the gate-source voltage is dissipated. As a result, this voltage drops below the switching threshold value and MOSFET 106 blocks.

The switch-off operation is retarded by the drain-gate capacitance of MOSFET 106. In the present case, additional retardation is achieved by the RC element between gate G and drain D of MOSFET 106.

In order further to retard the switch-off operation, in the case of the present arrangement, control unit 108 switches output 110 to high impedance upon switch-off of MOSFET 106. According to a preferred embodiment of the present invention, output 110 can be reconfigured into a measuring input, as indicated in FIG. 1 by comparator 114. A corresponding embodiment is explained below in the context of FIG. 3.

When output 110 is set to high impedance, the current that occurs upon dissipation of the gate-source voltage cannot flow through current limiting resistor 116 and output 110. This current instead flows through leakage resistor 118 to ground. A retardation of the switch-off operation can be achieved by appropriate dimensioning of leakage resistor 118. In this context, the size of leakage resistor 118 is selected as a function of a desired shutoff duration of MOSFET 106. The resistance of leakage resistor 118 is preferably greater than the resistance of current limiting resistor 116. Motor noises can be reduced by the retarded switch-off of MOSFET 106.

Control circuit 150 can advantageously be used in an ECM having a plurality of winding strands. Each winding strand has a corresponding control circuit associated with it; instead of a plurality of control units, for example, a corresponding number of respective outputs on a single microcontroller can be used. Each of these outputs is configured as described above. An application example of control circuit 150 in a two-strand ECM is explained with reference to FIG. 5.

FIG. 2A shows switching operations according to the existing art, specifically time courses of control signal CTRL of FIG. 1 and of a gate signal 220 that represents the gate-source voltage produced by control signal CTRL at MOSFET 106.

In order to illustrate the invention, FIG. 2A shows the gate signal for switch-on and switch-off operations that are carried out without setting output 110 to high impedance or switching it over as a measuring input. Schematic depictions of signal profiles for switch-on and switch-off operations in which output 110 is set to high impedance during corresponding switch-off operations, and/or is operated as a measuring input, are further explained below with reference to FIGS. 4 and 6.

According to FIG. 2A, at a time T1 control signal CTRL is set to, for example, +5 V in order to switch on MOSFET 106. A gate potential 220 of +4.2 V is generated in this context at MOSFET 106, causing the latter to become conductive. The switch-on operation is retarded (cf. switch-on edge 222) by the drain-gate capacitance of MOSFET 106 and by the RC element constituted by resistor 120 and capacitor 122. For switch-off, control signal CTRL is set to 0 V at a time T2. Gate signal 220 tracks control signal CTRL and drops to 0 V, with the result that MOSFET 106 blocks. The switch-off operation is once again retarded (cf. switch-off edge 224) by the drain-gate capacitance of MOSFET 106 and by the RC element.

At a time T3, control signal CTRL is then once again set to +5 V and the above-described operations repeat.

FIG. 2B shows a schematic depiction 300 of a profile of drain-source voltage 310 in MOSFET 106 of FIG. 1, which voltage is generated in reaction to gate signal 220 of FIG. 2A. For clarification, control signal CTRL and gate signal 220 of FIG. 2A are likewise depicted in FIG. 2B. It is noted, however, that the voltage axes in the diagrams of FIGS. 2A and 2B are at different scales, whereas the time axes are identical.

As FIG. 2B shows, drain-source voltage 310 equals 0 V as long as MOSFET 106 is switched on and a current can flow through it, i.e. from time T1 to time T2. Upon switch-off of MOSFET 106 at time T2, a drain-source voltage 310 occurs and rises to a MOSFET-specific maximum value until MOSFET 106 is completely switched off; it then decreases to a normal value dependent on the corresponding MOSFET and proceeds in substantially constant fashion at that normal value until the next switch-on of MOSFET 106. Illustratively, a voltage peak of approximately +36 V occurs, which drops to a normal value of approximately +13 V. The faster the switch-off operation of MOSFET 106, the shorter (and therefore steeper) a voltage peak 312 occurring in this context becomes.

When control signal CTRL is once again set to +5 V at time T3, drain-source voltage 310 drops back to 0 V because MOSFET 106 is once again being made conductive, and the operations described repeat.

FIG. 2C shows, by way of example, the profile of current 410 in winding strand 102 of FIG. 1, which profile is generated by control signal CTRL of FIG. 2A upon the switch-on and switch-off of MOSFET 106. Illustratively, current 410 in winding strand 102 rises, starting at time T1 at which MOSFET 106 is switched on, to a maximum value that is predetermined, inter alia, by the voltage at link circuit 124. Illustratively, this maximum value is approximately +10.5 A in the present example. Upon switch-off of MOSFET 106 at time T2, the current flow in strand 102 is interrupted and drops accordingly to 0 A. A winding-specific switch-off edge 412 occurs in this context.

The profile illustrated in FIG. 2C corresponds substantially to the so-called "sawtooth curve" that generally characterizes a coil current as a coil is switched on and off. The steeper the switch-off edge 412 in this context, the louder the motor noise becomes.

When control signal CTRL is again set to +5 V at time T3, current 412 in strand 102 rises again because MOSFET 106 is once again being made conductive, and the operations described repeat.

FIG. 3 is a simplified circuit diagram of a preferred embodiment of the invention in which output 110 is operated as a measuring input during the switch-off operation of MOSFET 106. Components used in this context that are identical (or function identically) to those in FIG. 1 are given the same reference characters and are not explained again.

The measuring input is implemented in control unit 108 of FIG. 3 as a measuring element 502. Measuring element 502 encompasses, for example, comparator 114 and an adjusting member 510. Output 110, and the positive pole of control pulse source 112, are connected to adjusting member 510. Output 110 is moreover connected to an input of comparator 114, output 130 of which is connected to a positive terminal of adjusting member 510.

During operation, the measuring input serves to measure a feedback signal RS that characterizes the degree of switch-off of MOSFET 106. Comparator 114 is configured, in this context, to compare feedback signal RS with a switching threshold value. This switching threshold value is delivered to comparator 114, for example, as a threshold voltage of a reference voltage source (not depicted).

In the example depicted in FIG. 3, feedback signal RS is the gate-source voltage and the switching threshold value is that value at which MOSFET 106 transitions from conductive to blocking mode. As described, the switching threshold value for MOSFETs of the IRLR 3410 type is between +1.8 V and +2 V. The measuring input thus serves, in the present example, to measure when the gate-source voltage reaches a value of less than +2 V to +1.8 V, by comparing the gate-source voltage with the switching threshold value. The degree of switch-off can be determined in this context; it indicates, for example, a deviation of the measured gate-source voltage from the switching threshold value. This determination of the degree of switch-off of MOSFET 106 makes possible improved coordination of the switch-on and switch-off operations of winding strand 102. An application example of a control unit in which one output is reconfigured as a measuring input is further explained below in the context of FIG. 5.

FIG. 4A shows, by way of example, time courses of control signal CTRL of FIGS. 1 or 3 and of a gate signal 610 that represents the gate-source voltage produced by control signal CTRL at MOSFET 106 of FIGS. 1 or 3, in the context of switch-off operations in which output 110 is set to high impedance, regardless of whether or not output 110 is operated as a measuring input. Schematic depictions of signal profiles in the context of switch-on and switch-off operations in which output 110 is set to high impedance during the switch-off operations, and is operated as a measuring input, in order to enable improved coordination of switch-on and switch-off operations of winding strand 102 with switch-on and switch-off operations of other winding strands, are further explained in the context of FIGS. 6C to 6D.

In the example depicted in FIG. 4A, the time courses of control signal CTRL and of gate signal 610 in the time interval from T1 to T2 correspond to the time courses of these signals depicted in FIG. 2A in the same time interval, and are not explained again.

At time T2 at which control signal CTRL is set to 0 V in FIG. 1 in order to switch off MOSFET 106, in FIG. 3 the output 110 of control unit 108 is set to high impedance so that gate signal 220 is dissipated in retarded fashion, as is evident from switch-off edge 620. In this context, the gate signal once again drops to less than +2 V, with the result that MOSFET 106 becomes blocked.

The switch-off operation is retarded on the one hand by the drain-gate capacitance of MOSFET 106 and by RC element 120, 122, and on the other hand by the high-impedance output 110. As described above, in FIG. 3 the gate-source voltage of MOSFET 106 is not dissipated through resistor 116 and output 110, since output 110 is set to high impedance upon shutoff. Instead, a current produced by the gate-source voltage flows through leakage resistor 118. If the resistance of current limiting resistor 116 is 10 k and the resistance of leakage resistor 118 is 51 k, the gate-source voltage is dissipated according to a standard electrical decay law approximately five times more slowly in FIG. 4A than in FIG. 2A, where the gate-source voltage is dissipated through current limiting resistor 116 and output 110. MOSFET 106 is accordingly switched off five times more slowly in the present example, when output 110 is set to high impedance during the switch-off operation.

At time T3, control signal CTRL is once again set to +5 V as described above in the context of FIG. 2A, and the operations described repeat.

FIG. 4B schematically shows the time course of drain-source voltage 710 in MOSFET 106 of FIG. 3, which voltage is generated in reaction to gate signal 610 of FIG. 4A. For clarification, control signal CTRL and gate signal 610 of FIG. 4A are likewise depicted in FIG. 4B. It is noted, however, that the voltage axes are at different scales in the diagrams of FIG. 4A and 4B.

The profile of drain-source voltage 710 corresponds substantially to the profile of drain-source voltage 310 of FIG. 2B and is therefore not explained again. It is noted, however, that in contrast to voltage peak 312, voltage peak 712 is wider, i.e. extended over time. This means that in the present example, the drain-source voltage requires more time to reach the maximum value after output 110 is switched over to high impedance, and also more time to decline from that maximum value to the normal value of approximately +13 V.

FIG. 4C schematically shows the profile of current 810 in winding strand 102 of FIG. 3, which current is generated upon switch-on and switch-off of MOSFET 106 using control signal CTRL of FIG. 4A. The time course of current 810 in winding strand 102 corresponds substantially to the time course of current 410 of FIG. 2C and is therefore not explained again. It is noted, however, that in contrast to shut-off edge 412 of FIG. 2C, switch-off edge 812 declines more slowly, i.e. winding strand 102 is switched off more slowly, as has already been explained above with reference to FIG. 4A. The motor noises occurring upon switch-off are thereby reduced.

FIG. 5 is a simplified circuit diagram of an arrangement 900 in which apparatus 100 according to FIG. 3 is utilized. Components that are identical (or function identically) to ones in FIG. 3 are given the same reference characters and are not explained again.

Unlike in FIG. 3, winding strand 102 in apparatus 900 is connected, for polarity protection, to the cathode of a diode 908 whose anode is connected to link circuit 124, e.g. to a battery or a power supply. The cathode of diode 908 is also connected to one end of a winding strand 902. The other end of winding strand 902 is connected to a semiconductor switch associated with winding strand 902, i.e. to drain D of an n-channel MOSFET 906. Drain D of MOSFET 906 is also connected via an RC element 920, 922 to gate G of MOSFET 906. Gate G of MOSFET 906 is further connected, via a control line 904 that comprises a current limiting resistor 916, to an output 910, associated with MOSFET 906, of control unit 108, and on the other hand is connected via a leakage resistor 918 to ground. Source S of MOSFET 906 is likewise connected to ground.

Similarly to output 110, output 910 can likewise be reconfigured as a measuring input, and can thus be operated as a high-impedance measuring input during the switch-off operation of MOSFET 906. The configuration of outputs 110 and 910 is depicted in simplified fashion as compared with the depiction in FIG. 3. This measuring input is accordingly implemented using a measuring element 930 that, by way of example, encompasses an adjusting member 914. The configuration of output 910 that can be reconfigured as a measuring input corresponds to that of output 110.

In arrangement 900, winding strands 102 and 902 illustratively represent the stator windings of a two-strand ECM 950 whose rotor is labeled 960. Control unit 108 serves to commutate these winding strands, each individual winding strand being controlled in the manner that was explained with reference to FIGS. 1, 3.

During operation, each of outputs 110 and 910 is operated as a measuring input in the context of the switch-off operation. This enables improved coordination of switch-on and switch-off operations of winding strands 102 and 902 in the context of commutation in ECM 950, and a reduction in the commutation noises that occur, as further explained with reference to FIG. 6.

FIG. 6A shows time courses of a first gate signal 1002 that represents the gate-source voltage at MOSFET 106 of FIG. 5, and of a second gate signal 1004 that represents the gate-source voltage at MOSFET 906 of FIG. 5. MOSFETs 106 and 906 are switched on and off alternately in this context, i.e. MOSFET 906 is switched on when MOSFET 106 is switched off, and vice versa. For clarification, FIG. 6A firstly illustrates switch-off operations in which outputs 110 and 910 are set to high impedance, independently of any operation of these outputs as measuring inputs. The time course of gate signal 1002, 1004 here corresponds substantially to the time course of gate signal 610 depicted in FIG. 4A, the voltage axes and time axes being at the scale in FIG. 4A and FIG. 6A. Slight differences between the time courses in FIG. 4A and 6A result from the occurrence of feedback effects between winding strands 102 and 902 of ECM 950, and are negligible in the context of the present invention. The time courses of gate signals 1002 and 1004 will therefore not be explained again.

It is noted, however, that at time T2 at which MOSFET 106 is switched off, MOSFET 906 is simultaneously switched on. Assuming that in the example depicted, MOSFET 106 is completely switched off only when the gate signal or gate-source voltage has dropped below the switching threshold value of +2 V, it is evident from FIG. 6A that MOSFET 106 is effectively switched off only as of time TA. Because MOSFET 906 is already switched on at time T2, however, winding strands 102 and 902 of ECM 950 are simultaneously supplied with electricity between T2 and TA, which is undesirable and reduces efficiency.

To avoid this, the switch-on and switch-off operations of these winding strands upon commutation are coordinated with one another by measuring the corresponding degree of switch-off, as will be further explained below in the context of FIGS. 6C and 6D.

At time T3, MOSFET 906 is switched off and MOSFET 106 is switched back on again as described above, in which context the operations described repeat.

FIG. 6B shows the time course of drain-source voltage 1102 in MOSFET 106 of FIG. 5, which voltage occurs in reaction to gate signal 1002 of FIG. 6A, as well as drain-source voltage 1104 in MOSFET 906 of FIG. 5, which voltage occurs in reaction to gate signal 1004 of FIG. 6A. The profiles of drain-source voltages 1102 and 1104 correspond substantially to the profile of voltage 710 of FIG. 4B, taking into consideration feedback effects that may occur in the associated winding strands 102 and 902 respectively, as was described in the context of FIG. 6A.

FIG. 6C shows the time courses of a first gate signal 1202 and a second gate signal 1204 according to a preferred embodiment of the present invention. First gate signal 1202 is the gate-source voltage at MOSFET 106 of FIG. 5, and second gate signal 1204 is the gate-source voltage at MOSFET 906 of FIG. 5. As in FIG. 6A, here as well MOSFETs 106 and 906 are switched on and off alternately.

FIG. 6C shows the gate signals in the context of switch-off operations in which outputs 110 and 910 are set to high impedance and are operated as measurement inputs. In this context, the degrees of switch-off of MOSFETs 106 and 906 are ascertained and are used to control the switching operations of said MOSFETs.

In FIG. 6C, the profiles of gate signals 1202 and 1204 correspond substantially to the time courses of gate signals 1002 and 1004 of FIG. 6A, although they are shown in FIG. 6C with a time offset. Correspondingly, at time T2 at which MOSFET 106 is switched off, MOSFET 906 is not yet switched on. Instead, the switch-on operation of MOSFET 906 is delayed by an amount equal to a duration Δt and thus takes place at a time TD=T2+Δt.

According to a preferred embodiment of the present invention, the time delay is approximately $$\Delta t = 0.2 \ldots 0.25 \times t\_Aus \quad (1),$$

in which t_Aus is the time duration required, for a predetermined type of MOSFET, for the gate-source voltage to dissipate from the maximum value to the switching threshold value. In the present example this is, for example, the time duration required for the maximum gate-source voltage of +4.2 V at MOSFET 106 to dissipate to approximately +2 V. The time duration t_Aus can be specified by way of test measurements. It is defined by the resistors R116 (e.g. 10 k) and R118 (e.g. 51 k) according to the rough formula $$\Delta t = R116/R118 * t\_Aus \quad (2).$$

For the resistance values indicated, this yields $$\Delta t = 10/51 * t\_Aus = 0.2 * t\_Aus \quad (3).$$

FIG. 6D shows the time course of drain-source voltage 1302 in MOSFET 106 of FIG. 5, which voltage is generated in reaction to gate signal 1202 of FIG. 6A, as well as drain-source voltage 1304 of MOSFET 906 of FIG. 5, which voltage is generated in reaction to gate signal 1204 of FIG. 6A. The time course of drain-source voltages 1302 and 1304 corresponds substantially to the time course of drain-source voltages 1102 and 1104 of FIG. 6B, which voltages likewise proceed in FIG. 6D, in accordance with the time delay described in the context of FIG. 6C, with a time offset from one another.

FIG. 7 is a flow chart of an exemplifying method for controlling the current supplied to the winding strands of an electric motor. For illustration, it is depicted as a method for controlling the current supplied to the two winding strands 102 and 902 of ECM 950 of FIG. 5. Method 1400 begins in step S1402.

In step S1404, a first output VT1 of a control unit (e.g. output 110 of control unit 108 of FIG. 5) is operated as an output, and a first control signal VT1=1 is generated at that output in order to switch on a first semiconductor switch (e.g.

MOSFET 106 of FIG. 5). The first control signal is delivered to the first semiconductor switch, which is thus switched on and generates a current flow in an associated first winding strand (e.g. winding strand 102 of FIG. 5).

In step S1406, VT1 is set to high impedance (Tristate), and is reconfigured in order to be operated subsequently as a measuring input.

In step S1408, the degree of switch-off of first semiconductor switch 106 is ascertained at said measuring input by measuring voltage UGS. In step S1410, the control unit determines whether UGS=A (4), i.e. whether the ascertained voltage UGS corresponds to a predetermined degree of switch-off A at which first semiconductor switch 106 is switched off.

In an embodiment, the predetermined degree of switch-off A is reached when a time duration Δt=0.25×t_Aus, described above in the context of FIG. 6C, has elapsed since the time at which switch-off was initiated (e.g. time T2 in FIG. 6C).

If the required degree of switch-off A has not yet been reached, first output VT1 continues to be operated as a measuring input and the program returns to step S1408. If the required degree of switch-off A has been reached, the program goes to step S1412.

In step S1412, a second output VT2 of the control unit (e.g. output 910 of control unit 108 of FIG. 5) is operated as an output; a second control signal VT2=1 is generated at VT2 in order to switch on MOSFET 906 of FIG. 5, and is delivered to said MOSFET, which is thereby switched on and generates a current flow in winding strand 902. In step S1414, VT2 is switched over to high impedance (Tristate) in order to be operated subsequently as a measuring output.

In step S1416, voltage UGS at MOSFET 906 is ascertained at this measuring input as described above. In step S1418, the control unit determines whether the ascertained voltage UGS corresponds to a predetermined degree of switch-off A. If the required degree of switch-off A has not yet been reached, the second output continues to be operated as a measuring input and the program returns to step S1416. If the required degree of switch-off A has been reached, the program returns to step S1404.

It is noted that first output VT1 and second output VT2 can each be set to high impedance (and operated as a measurement input) until a new switch-on operation for the associated semiconductor switch is initiated at the corresponding output. The program according to FIG. 7 begins upon startup of ECM 950 and continues as long as the ECM is being operated, in order to reduce commutation noises and improve the coordination of switch-on and switch-off operations in the context of commutation.

Numerous variants and modifications are of course possible within the scope of the present invention.

The invention claimed is:

1. An electronically commutated motor comprising:
a permanent magnet rotor (960);
a stator having a first winding strand (102), associated with which is a first field-effect transistor (106) that, under the control of a potential at a control electrode (G) thereof, serves during operation to control the current through the first winding strand (102);
a second winding strand (902), associated with which is a second field-effect transistor (906) that, under the control of a potential at a control electrode (G), serves during operation to control the current through the second winding strand (902),
the first field-effect transistor (106) and the second field-effect transistor (906) being adapted to be switched on alternately during operation under the control of commutation operations;
a first source (112, 510) of control signals (VT1, 1202) for controlling the first field-effect transistor (106);
a second source (912, 914) of control signals (VT2, 1204) for controlling the second field-effect transistor (906);
a first measuring apparatus (510) for sensing the potential at the control electrode of the first field-effect transistor (106);
a second measuring apparatus (914) for sensing the potential at the control electrode of the second field-effect transistor (906);
a program controlled arrangement (108) which is implemented to carry out, during operation, the following steps:
during a commutation operation, switching to a high impedance the control electrode of that one of the two field-effect transistors (106, 906) that is controlled to be conductive at that instant is switched to high impedance;
using the measuring apparatus (510, 9140 associated with the current conductive field-effect transistor to sense any changes in potential at the control electrode (G) thereof; and
after said potential has reached a predetermined degree of switch-off (A) of the associated field-effect transistor, applying a switch on signal to the control electrode of the other field-effect transistor from the source (112, 510) for control signals associated with said transistor.

2. The motor according to claim 1, further comprising
a current limiting resistor (116; 916) arranged between a source (112, 912) of control signals and an associated one of said first and second field-effect transistors,
and which serves for applying, in operation, a control signal to said field-effect transistor.

3. The motor according to claim 2, further comprising a leakage resistor (118; 918) arranged between control electrodes of a field-effect transistor and serving, upon switch-off, to reduce the current through said field-effect transistor in accordance with a predetermined electrical decay law.

4. The motor according to claim 3,
wherein the resistance of the leakage resistor (118; 918) is greater than the resistance of the current limiting resistor (116; 916).

5. The motor according to claim 3,
wherein the GATE terminal of the field-effect transistor is connected to the associated current limiting resistor and to one terminal of the associated leakage resistor,
the source terminal and the other end of the leakage resistor being connected to one another, and
the drain terminal being connected to the associated winding strand.

6. The motor according to claim 5,
wherein an RC element (120, 122) is provided between the gate terminal and the drain terminal of an associated field-effect transistor (106).

7. The motor according to claim 1, wherein
the output (110, 910) of said source (108) of control signals is adapted to be reconfigured, at least upon switch-off of the associated field-effect transistor (106), to serve as a measuring input adapted to measure the degree of switch-off (A) of the associated field-effect transistor.

8. The motor according to claim 7, wherein
each source (108) of FET control signals has, associated with it, a comparator (114) adapted for comparing a feedback signal (104) with a switching threshold value (A) in order to ascertain the degree of switch-off of the associated field-effect transistor.

9. The motor according to claim 1, wherein
the program-controlled arrangement (108) is configured to switch on the second field-effect transistor (906) when the first field-effect transistor (106) is switched off, and to switch if off when the first field-effect transistor is switched on.

10. The motor according to claim 9, wherein
the first source of control signals is adapted to transform, at least upon switch-off of the first field-effect transistor, into a measuring input for measuring a motor signal which characterizes the degree of switch-off of the associated first field-effect transistor,
the first source (108) comprising a comparator (114) adapted to compare said motor signal with a switching threshold value (A) in order to determine the degree of switch-off of the first field-effect transistor,
the first source being furthermore configured to switch on the second field-effect transistor (906) by means of the second control signal only when the degree of switch-off of the first field-effect transistor indicates that the latter is switched off.

11. The motor according to claim 9, which further comprises
a plurality of current limiting resistors (116, 916), each current limiting resistor being arranged between a respective one of said field-effect transistors (106, 906) and the respective output of the source of control signals associated with said field-effect transistor, and serving to deliver the corresponding control signal (VT1, VT2) to the respective field-effect transistor (106, 906).

* * * * *